United States Patent [19]
Ariie

[11] Patent Number: 5,973,576
[45] Date of Patent: *Oct. 26, 1999

[54] MIXER FOR MIXING CARRIER SIGNALS AND DATA SIGNALS

[75] Inventor: Mitsuo Ariie, Nagaokakyo, Japan

[73] Assignee: Murata Manufacturing Co., Ltd., Japan

[ * ] Notice: This patent is subject to a terminal disclaimer.

[21] Appl. No.: 08/966,294

[22] Filed: Nov. 7, 1997

Related U.S. Application Data

[63] Continuation of application No. 08/686,327, Jul. 25, 1996, Pat. No. 5,686,870.

[30] Foreign Application Priority Data

Jul. 25, 1995 [JP] Japan ..................................... 7-189224

[51] Int. Cl.$^6$ .............................. H03C 1/00; H03C 1/54
[52] U.S. Cl. .......................... 332/168; 332/178; 455/333
[58] Field of Search .................................. 332/167–171, 332/178, 179; 331/37, 42, 168; 455/333

[56] References Cited

U.S. PATENT DOCUMENTS

| | | | |
|---|---|---|---|
| 4,912,520 | 3/1990 | Yamamoto et al. | 455/333 |
| 5,396,659 | 3/1995 | Kimura | 455/333 |
| 5,686,870 | 11/1997 | Ariie | 332/168 |

FOREIGN PATENT DOCUMENTS 0308273 3/1989 European Pat. Off. .
1803620 10/1968 Germany .

OTHER PUBLICATIONS

German Office Action dated Jul. 24, 1996 and translation.

*Primary Examiner*—David Mis
*Attorney, Agent, or Firm*—Ostrolenk, Faber, Gerb & Soffen, LLP

[57] ABSTRACT

A low-powered mixer that is operable at a low voltage by a single positive power supply. A predetermined voltage and a first data signal Ss1 superimposed on the predetermined voltage are input into the drain D of an FET Q1, while a first carrier signal Sc1 is input into the FET Q1's gate G. The FET Q1 thus generates a first mixed signal So1 by mixing the first data signal Ss1 and the first carrier signal Sc1. A predetermined voltage and a second data signal Ss2 superimposed on the predetermined voltage are input into the FET Q2's drain D, while a second carrier signal Sc2 is input into the FET Q2's gate G. The FET Q2 thus generates a second mixed signal So2 by mixing the second data signal Ss2 and the second carrier signal Sc2. A capacitor C5 causes the sources S of the FETs Q1 and Q2 to float for DC and to be grounded for AC.

10 Claims, 7 Drawing Sheets

MIXER FOR MIXING CARRIER SIGNALS AND DATA SIGNALS

This is a continuation of application Ser. No. 08/686,327, filed Jul. 25, 1996 now U.S. Pat. No. 5,686,870.

BACKGROUND OF THE INVENTION

1. Field of the Invention

The present invention relates generally to a mixer used in various types of modulators, such as orthogonal modulators, demodulators, detectors, multipliers, frequency converters, etc. More specifically, the invention relates to a mixer for mixing a pair of carrier signals 180° out of phase with each other, with a pair of data signals 180° out of phase with each other.

2. Description of the Related Art

Referring to the circuit diagram shown in FIG. 6, a modulator including a conventional mixer has signal input terminals I100, I200 and I300, signal output terminals O100, and O200, a DC power supply E, choke resistors R100 and R200, a double balanced mixer (hereinafter referred to as "the DBM") 100, a differential amplifier 200, and a constant current circuit 300. A data signal Ss (for example, a sine wave having a frequency fs at 50 kHz) is applied onto the signal input terminal I100. A first carrier signal Sc1 having a frequency higher than the data signal Ss (for example, a sine wave having a frequency fc at 1.5 GHz), is applied onto the signal input terminal I200. Further, a second carrier signal Sc2 180° out of phase with the first carrier signal Sc1, is applied onto the signal input terminal I300. The DBM 100 has four FETs Q100, Q200, Q300 and Q400. The differential amplifier 200 includes two FETs Q500, Q600 and a capacitor C100. The constant current circuit 300 has an FET Q700 and a bias resistor R300. The DBM 100, the differential amplifier 200 and the constant current circuit 300 are connected to each other and are supplied with power from the DC power supply E via the choke resistors R100 and R200.

Referring to the waveform diagram shown in FIG. 7, the operation of the modulator shown in FIG. 6 will now be explained. More specifically, FIG. 7($a$) indicates the first and second carrier signals Sc1 and Sc2; FIG. 7($b$) designates the first and second data signals Ss1 and Ss2; and FIG. 7($c$) represents an amplitude-modulated signal So which is output between the signal output terminals O100 and O200.

The data signal Ss is input to the gate G of the FET Q500 of the differential amplifier 200 via the signal input terminal I100. The total amounts of the currents flowing in the sources S and the drains D of the FETs Q500 and Q600 are each regulated to a constant level by the FET Q700 of the constant current circuit 300. Accordingly, a first data signal Ss1 (indicated by the solid line in FIG. 7($b$)) and a second data signal Ss2 (indicated by the dotted line in FIG. 7($b$)) 180 degrees out of phase with each other are output from the drain of the FET Q500 and the drain of the FET Q600, respectively. The first data signal Ss1 is supplied to the sources S of the FETs Q100 and Q200 of the DBM 100, while the second data signal Ss2 is fed to the sources S of the FETs Q300 and Q400. On the other hand, the first carrier signal Sc1 (indicated by the solid line in FIG. 7($a$)) is supplied to the gates G of the FETs Q100 and Q300, while the second carrier signal (designated by the dotted line in FIG. 7($a$)) is fed to the gates G of the FETs Q200 and Q400.

The FET Q100 mixes the first carrier signal Sc1 with the first data signal Ss1 so as to output from the drain D of the FET Q100 a mixed signal So1 including a sideband component in the frequency range (fc±fs). Also, the FET Q200 mixes the second carrier signal Sc2 with the first data signal Ss1 so as to output from the drain D of the FET Q200 a mixed signal So2 including a sideband component in the frequency range (fc±fs). Further, the FET Q300 mixes the first carrier signal Sc1 with the second data signal Ss2 so as to output from the drain D of the FET Q300 a mixed signal So3 including a sideband component in the frequency range (fc±fs). The FET Q400 mixes the second carrier signal Sc2 with the second data signal Ss2 so as to output from the drain D of the FET Q400 a mixed signal So4 including a sideband component in the frequency range (fc±fs).

The mixed signals So1 and So4 are directly coupled and synthesized, so that a mixed signal So1+So4 is output from the signal output terminal O100. On the other hand, the mixed signals So2 and So3 are directly coupled and synthesized, so that a mixed signal So2+So3 is output from the signal output terminal O200. As a result, a balanced amplitude-modulated signal So is output between the signal output terminals O100 and O200.

Since cellular mobile telephones are coming into wide use, there is increasingly a demand for a lower-powered and smaller-sized mixer that is operable at a lower voltage by a single positive power supply.

However, this conventional mixer is connected in series to other circuits (a differential amplifier and a constant current circuit). For rendering this type of mixer operable, it is thus necessary to supply at least 5.5 V from the DC power supply E. The total of 5.5 V equals the sum of the following: a voltage required for making the FETs Q100 to Q400 of the DBM 100 operable (for example, 1.5 V); a voltage required for actuating the FETs Q500 and Q600 of the differential amplifier 200 (for example, 1.5 V); a voltage required for rendering the FET Q700 of the constant current circuit 300 operable (for example, 1.5 V); a voltage drop generated by a current flowing in the bias resistor R300 (for example, 0.5 V); and a voltage drop generated by a current flowing in the choke resistors R100 and R200 (for example, 0.5 V). This makes it difficult to operate the mixer at a lower voltage. Additionally, since a current is necessary to actuate the mixer, it is difficult to satisfy the demand for a lower-powered mixer.

One possible measure to render the DBM 100 operable at a lower voltage may be to insert a capacitor between each element of the DBM 100 and the differential amplifier 200 so as to block DC between those components. Further, a bias circuit may be provided for each of the DBM 100 and the differential amplifier 200, which can thus be individually supplied with power. Additionally, for achieving the downsizing of the mixer, the mixer may be formed as an IC, and the capacitors to be inserted between the DBM 100 and the differential amplifier 200 may be formed within the IC.

However, the above-described techniques not only increase the complexity in the circuit, but also connect the DBM 100 and the differential amplifier 200 in parallel with each other with respect to DC. Since both of the components dissipate current, the total dissipated power is contradictorily increased. Additionally, the capacitance of a capacitor formed within an IC is, in general, restricted to several dozens of pF, which is not sufficient to handle a data signal having a lower frequency.

SUMMARY OF THE INVENTION

Accordingly, it is an object of the present invention to provide a low-powered mixer which is operable at a lower voltage by a single positive power supply, free from the above-described technical problems encountered by the known art.

It is another object of the present invention to provide a mixer which can be easily formed as an IC so as to handle a data signal at a lower frequency.

In order to achieve the above objects, according to one aspect of the present invention, there is provided a mixer for mixing a pair of carrier signals 180 degrees out of phase with each other with a pair of data signals 180 degrees out of phase with each other, the mixer comprising: a first FET for generating a first mixed signal by mixing one of the pair of data signals and one of the pair of carrier signals as a result of inputting a predetermined voltage and the above-mentioned data signal superimposed on the predetermined voltage into the first FET's drain and by inputting the above-mentioned carrier signal into the first FET's gate; a second FET for generating a second mixed signal by mixing the other of the pair of data signals and the other of the pair of carrier signals as a result of inputting a predetermined voltage and the above-mentioned data signal superimposed on the predetermined voltage into the second FET's drain and by inputting the above-mentioned carrier signal into the second FET's gate; and at least one first capacitor for causing the first and second FETs'sources to float with respect to direct current and to be grounded with respect to alternating current.

According to this aspect of the present invention, a predetermined voltage is input into each of the first and second FETs'drains, and the first capacitor causes the first and second FETs'sources to float for DC and to be grounded for AC. With this construction, it is sufficient to supply only a low voltage such that the FET's drain-source voltage being larger than the FET's gate voltage can be guaranteed. Also, it is possible to prevent DC from flowing in the first and second FETS, which obviates the power that would be otherwise dissipated in the first and second FETs, thereby enabling a low-voltage operation.

According to another aspect of the present invention, the mixer may further comprise a pair of second capacitors for generating a third mixed signal by synthesizing the first and second mixed signals, the second capacitors being connected in series to each other between the first and second FETs'drains and exhibiting a low impedance at a frequency of the first and second mixed signals and exhibiting a high impedance at a frequency of the data signals.

According to this aspect of the present invention, a pair of second capacitors exhibit a low impedance at a frequency of the first and second mixed signals and exhibit a high impedance at a frequency of the data signals. This requires only a small capacitance of the second capacitors if the frequency of the mixed signals is in a quasi-microwave range or higher. The mixer can thus be easily formed as an IC.

According to still another aspect of the present invention, the mixer may further comprise a pair of inductors each of which is connected at one end to one of the first and second FETs'drains, respectively, and which exhibit a high impedance at a frequency of the mixed signals and exhibit a low impedance at a frequency of the data signals.

According to this aspect of the present invention, a pair of inductors exhibit a high impedance at a frequency of the mixed signal (fc±fs) and exhibit a low impedance at a frequency of the data signals. With this arrangement, only a small inductance of the inductors is required if the frequency of the mixed signals is in a quasi-microwave range or higher. This enhances the ease of forming the mixer as an IC. It is also possible to prevent the entry of the first and second mixed signals to the outside of the inductors.

DESCRIPTION OF PREFERRED EMBODIMENTS

Figure 1:
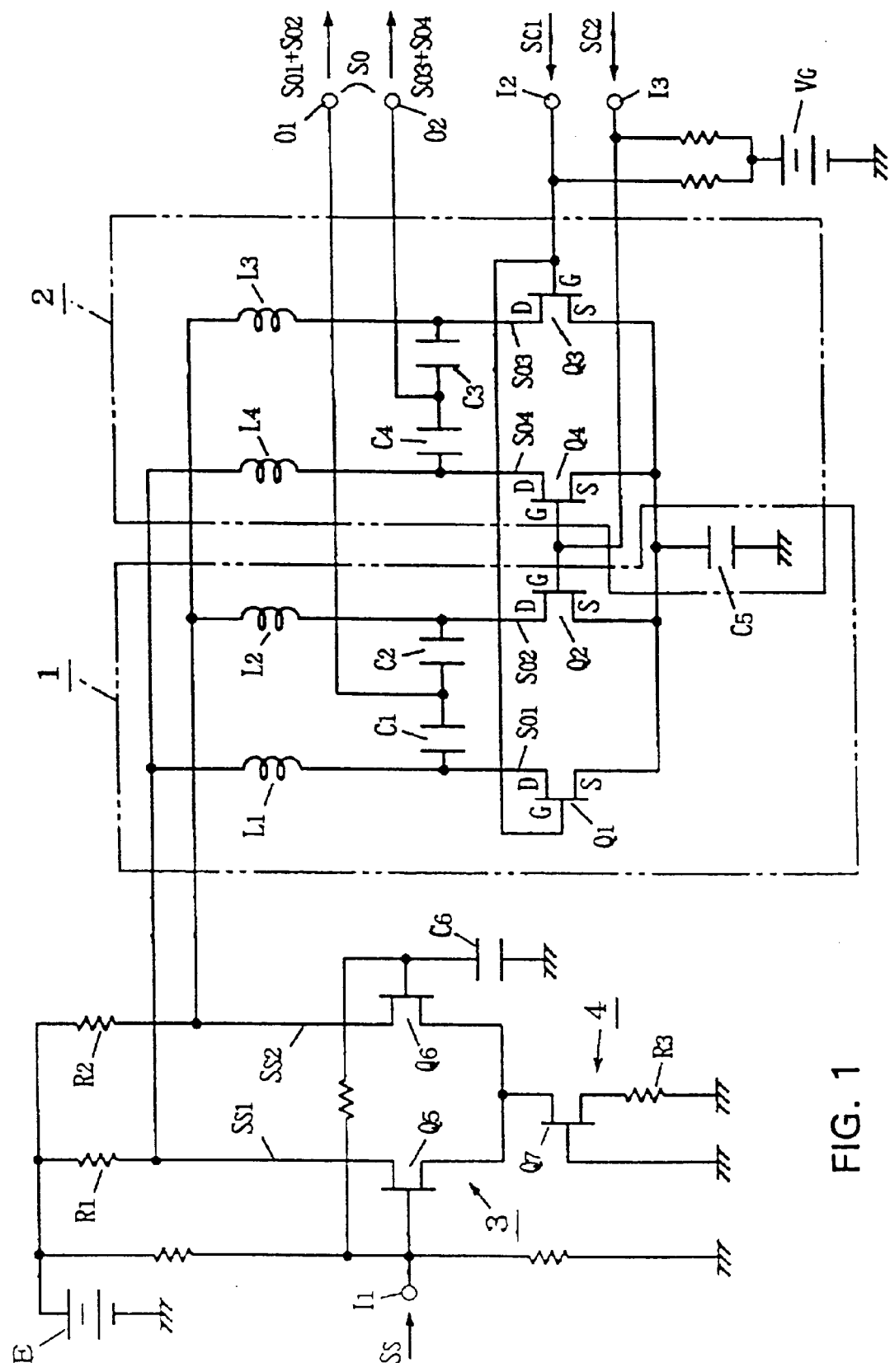
FIG. 1 is a circuit diagram of the configuration of a modulator having two mixers according to an embodiment of the present invention.

Embodiments of the present invention will now be described with reference to the drawings. Referring to a circuit diagram illustrated in FIG. 1, a modulator having two mixers according to an embodiment of the present invention includes signal input terminals I1, I2 and I3, signal output terminals O1 and O2, a DC power supply E, two choke resistors R1 and R2, two balanced mixers (hereinafter referred to as "the BM") 1 and 2, a differential amplifier 3, and a constant current circuit 4.

A data signal Ss (for example, a sine wave having a frequency fs at 50 kHz) is input into the signal input terminal I1. Input into the signal input terminal I2 is a first carrier signal Sc1 (for example, a sine wave having a frequency fc at 1.5 GHz). Further, input into the signal input terminal I3 is a second carrier wave Sc2 180 degrees out of phase with the first carrier signal Sc1.

The BM 1 includes two FETs Q1 and Q2, three capacitors C1, C2 and C5, and two coils L1 and L2, while BM2 has two FETs Q3 and Q4, three capacitors C3, C4 and C5, and two coils L3 and L4. Namely, the BMs 1 and 2 share the capacitor C5. The BMs 1 and 2 also form a double balanced mixer in cooperation with each other.

The capacitor C5, which is disposed between the respective sources S of the FETs Q1 to Q4 and ground, has such a capacitance (for example, 10 pF) as to cause the sources S of the FETs Q1 to Q4 to float for DC and to be grounded for AC. The capacitors C1 and C2 are connected in series to each other between the drains D of the FETs Q1 and Q2, while the capacitors C3 and C4 are connected in series to each other between the drains D of the FETs Q3 and Q4. The capacitors C1 to C4 have such a capacitance (for example, 10 pF) as to exhibit a low impedance at a frequency of the first and second mixed signals So1 and So2 and to exhibit a high impedance at a frequency fs of the first and second data signals Ss1 and Ss2. The coils L1 and L4 are connected in series to each other between the drains D of the FETs Q1 and Q4, while the coils L2 and L3 are connected in series to each other between the drains D of the FETs Q2 and Q3. The coils L1 to L4 have such an inductance (for example, 10 nH) as to exhibit a high impedance at a frequency of the first and second mixed signals So1 and So2 and to exhibit a low impedance at a frequency fs of the first and second data signals Ss1 and Ss2.

The differential amplifier 3 has two FETs Q5 and Q6 and a capacitor C6. The constant current circuit 4 includes an FET Q7 and a bias resistor R3. The differential amplifier 3 and the constant current circuit 4 are supplied with power from the DC power supply E via the choke resistors R1 and R2. The BMs 1 and 2, the differential amplifier 3 and the constant current circuit 4, except for the capacitor C5, are formed as an IC on a single substrate. Only 4 V of power is required to be supplied to the BMs 1 and 2, the differential amplifier 3 and the constant current circuit 4 from the DC power supply E via the choke resistors R1 and R2. The total of 4 V equals the sum of the following: a voltage drop generated in the bias resistor R3 (for example, 0.5 V); a voltage drop generated in the choke resistors R1 and R2 (for example, 0.5 V); a voltage for actuating the FETs Q5 and Q6 of the differential amplifier 3 (for example, 1.5 V); and a voltage for rendering the FET Q7 of the constant current circuit 4 operable (for example, 1.5 V). On the other hand, for effecting the operation of the FETs Q1 to Q4 of the BMs 1 and 2, it is only necessary to supply a low voltage (for example, 1.5 V or lower) such that each FET's drain D-source S voltage is larger than the FET's gate G voltage. Accordingly, a 4 V power supply is sufficient to operate the BMs 1 and 2, the differential amplifier 3 and the constant current circuit 4.

Figure 2A:
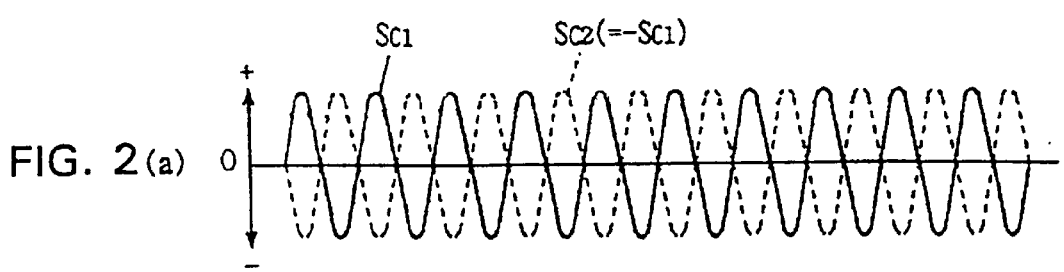
FIGS. 2(a) to 2(c) are waveform diagrams illustrating the operation of the modulator shown in FIG. 1.
Figure 2B:
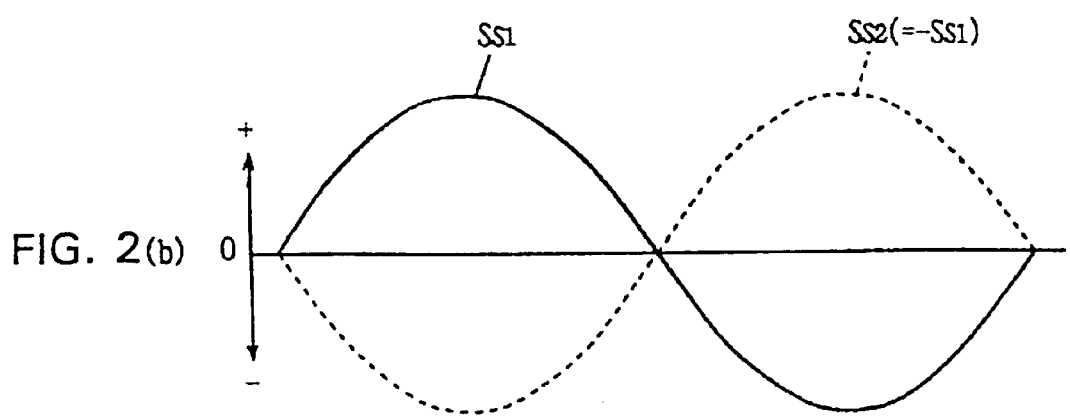
Figure 2C:
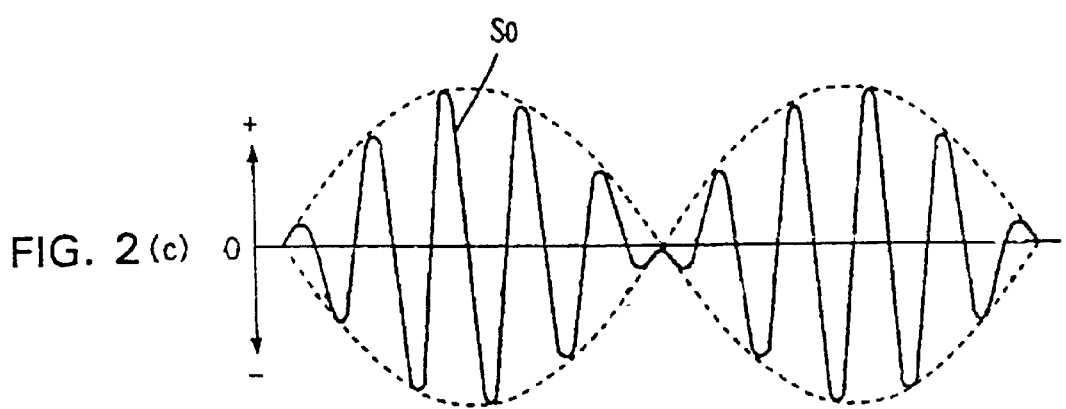

An explanation will now be given of the operation of the modulator constructed as described above, while referring to a waveform diagram of FIGS. 2(a)–2(c). More specifically, FIG. 2(a) indicates first and second carrier signals Sc1 and Sc2; FIG. 2(b) represents first and second data signals Ss1 and Ss2; and FIG. 2(c) designates an amplitude-modulated signal So output between the signal output terminals O1 and O2.

Provided with power supplied from the DC power supply E to the differential amplifier 3 and the constant current circuit 4, a constant DC flows in the FET Q7 and the bias resistor R3 via the choke resistors R1 and R2 and the FETs Q5 and Q6. On the other hand, provided with power from the DC power supply E to the BMs 1 and 2, the sources S of the FETs Q1 and Q4 are caused to be in the opened state for a DC because of the capacitor C5, whereby the drains D of the FETs Q1 to Q4 and sources S reach the same potential. Also, the presence of the capacitor C5 prevents the flowing of DC in the FETs Q1 to Q4, which totally eliminates the power that would be otherwise dissipated by the FETs Q1 to Q4, thereby enabling the operation of the modulator at a lower voltage.

The data signal Ss is input into the FET Q5's gate G of the differential amplifier 3 via the signal input terminal I1. The total amounts of the current flowing in the sources S of the FETs Q5 and Q6 and the current flowing in the drains D of the FETs Q5 and Q6 are each regulated to a constant level by the FET Q7 of the constant current circuit 4. Accordingly, the first data signal Ss1 (indicated by the solid line in FIG. 2(b)) and the second data signal Ss2 (designated by the dotted line in FIG. 2(b)) 180° out of phase with each other are output from the drains D of the FETs Q5 and Q6, respectively.

The first data signal Ss1 is supplied to the drains D of the FETs Q1 and Q4 via the coils L1 and L4 of the BMs 1 and 2, respectively, while the second data signal Ss2 is fed to the drains D of the FETs Q2 and Q3 via the coils L2 and L3 of the BMs 1 and 2, respectively. On the other hand, the first carrier signal Sc1 (indicated by the solid line in FIG. 2(a)) is supplied to the gates G of the FETs Q1 and Q3, while the second carrier signal Sc2 (designated by the dotted line of FIG. 2(a)) is fed to the gates G of the FETs Q2 and Q4.

The FET Q1 mixes the first carrier signal Sc1 with the first data signal Ss1 so as to output from the FET Q1's drain D a mixed signal So1 including a sideband component in the frequency range (fc±fs). Also, the FET Q2 mixes the second carrier signal Sc2 with the second data signal Ss2 so as to output from the FET Q2's drain D a mixed signal So2 including a sideband component in the frequency range (fc±fs). Further, the FET Q3 mixes the first carrier signal Sc1 with the second data signal Ss2 so as to output from the FET Q3's drain D a mixed signal So3 including a sideband component in the frequency range (fc±fs). The FET Q4 mixes the second carrier signal Sc2 with the first data signal Ss1 so as to output from the FET Q4's drain D a mixed signal So4 including a sideband component in the frequency range (fc±fs).

The mixed signals So1 and So2 are synthesized by the capacitors C1 and C2, so that the resulting mixed signal So1+So2 is output from the signal output terminal O1. On the other hand, the mixed signals So3 and So4 are synthesized by the capacitors C3 and C4, so that the resulting mixed signal So3+So4 is output from the signal output terminal O2. As a consequence, a balanced amplitude-modulated signal So is output between the signal output terminals O1 and O2.

The capacitors C1 to C4 have such a capacitance as to exhibit a low impedance at a frequency fc of the first and second carrier signals Sc1 and Sc2 and to exhibit a high impedance at a frequency fs of the first and second data signals Ss1 and Ss2. Accordingly, the first and second data signals Ss1 and Ss2 are positively input into the drains D of the FETs Q1 to Q4, being prevented from entering into the capacitors C1 to C4. On the other hand, the coils L1 to L4 have such an inductance as to present a high impedance at a frequency of the first and second mixed signals So1 and So2 and to present a low impedance at a frequency Fs of the first and second data signals Ss1 and Ss2. This prevents the entry of the first and second mixed signals So1 and So2 into the coils L1 to L4. Also, only a small capacitance of the capacitors C1 to C4 and merely a small inductance of the coils L1 to L4 are required if the frequency of the mixed signals is in a quasi-microwave range or higher, thereby enhancing the ease of formation of the modulator as an IC.

Figure 3:
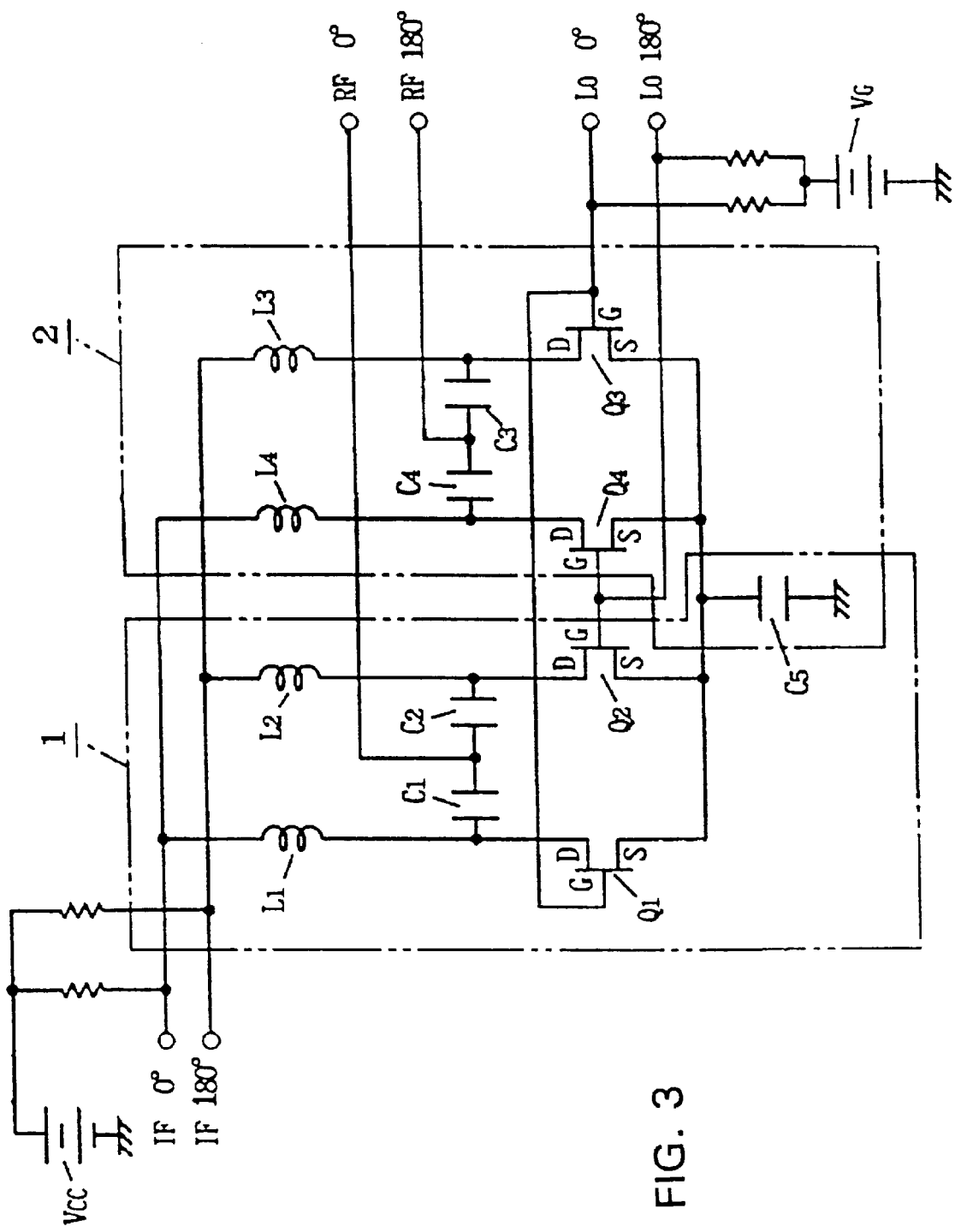
FIG. 3 is a circuit diagram of the configuration of another embodiment of the present invention.

FIG. 3 is a circuit diagram of the configuration of another embodiment of the present invention. As shown in FIG. 3, local signals (having a phase difference of 180°) are input into the gates G of the FETs Q1 to Q4, and a DC voltage Vcc and RF signals (having a phase difference of 180°) are input into the drains D of the FETs Q1 to Q4 via the capacitors C1 to C4, respectively. Accordingly, IF signals indicating a difference between the RF frequency and the carrier frequency can be obtained from the drains D of the FETs Q1 to Q4 via the coils L1 to L4, respectively. The capacitors C1 to C4 have such a capacitance as to exhibit a low impedance for the RF signals and a high impedance for the IF signals. On the other hand, the coils L1 to L4 have such an inductance as to present a high impedance for the RF signals and a low impedance for the IF signals. The IF signal frequency is lower than the local signal frequency and the RF signal frequency. In this manner, the modulator may be used as a down-converter.

Figure 4:
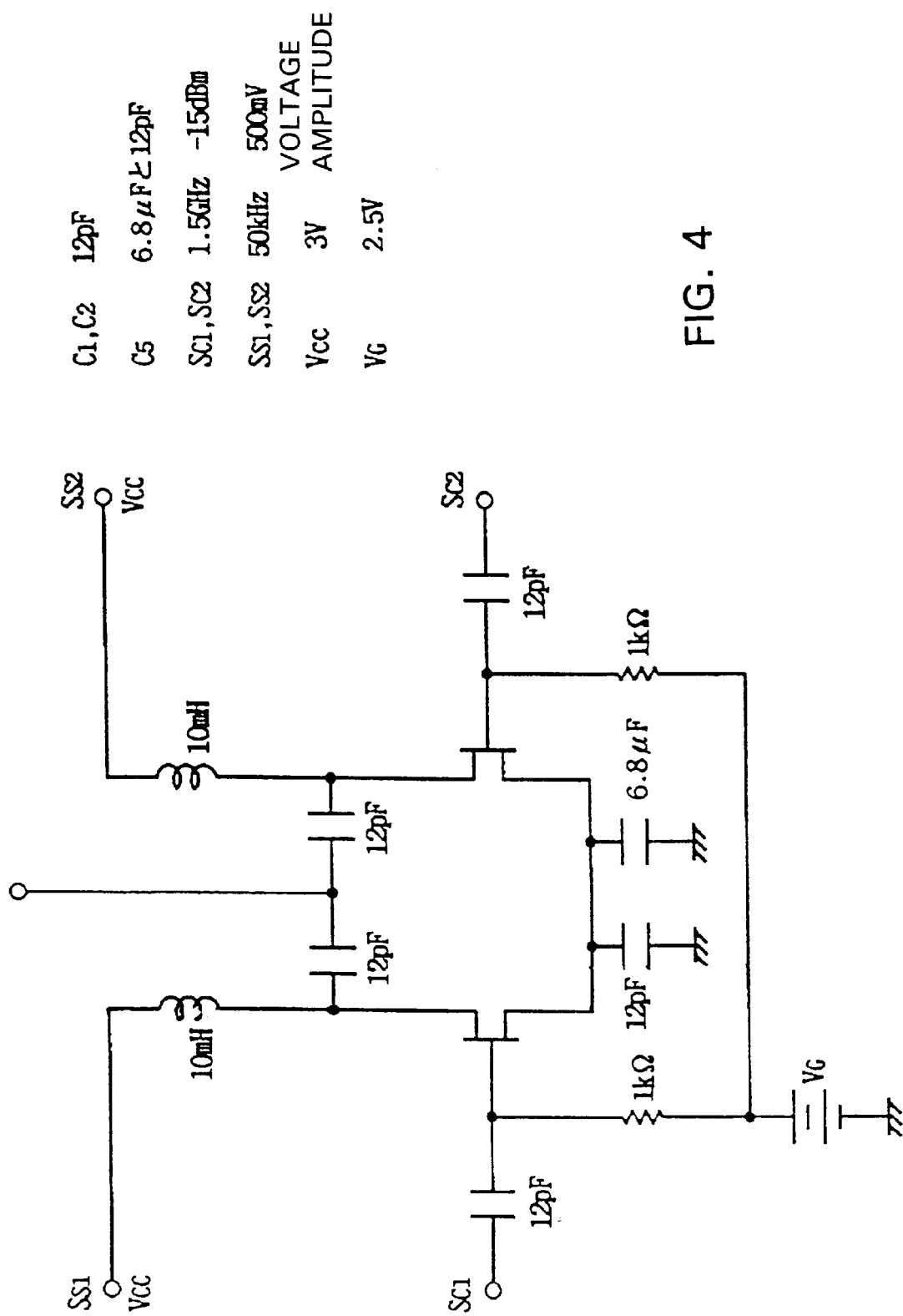
FIG. 4 is a circuit diagram of a balanced mixer for use in a performance test.
Figure 5:
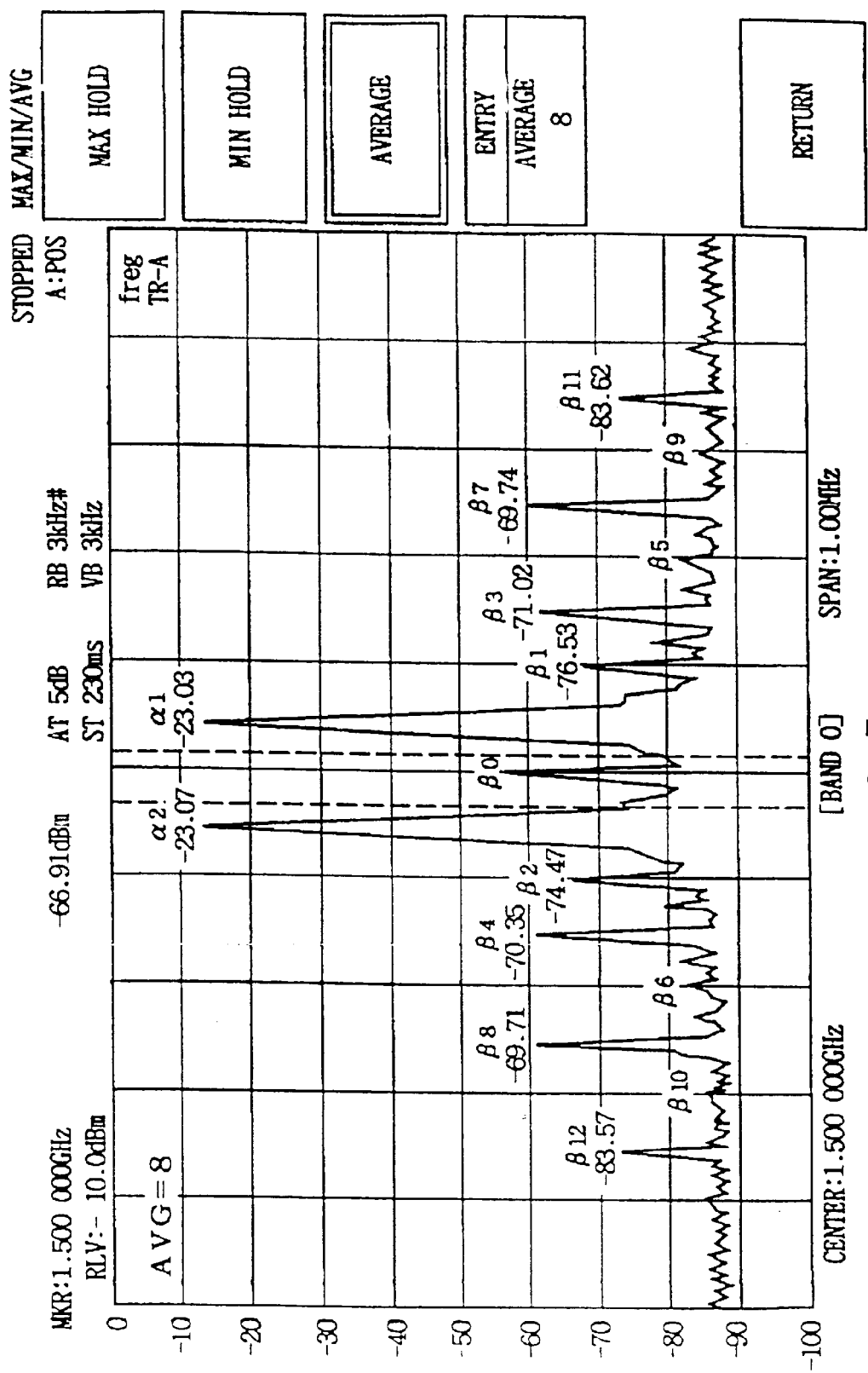
FIG. 5 illustrates spectrum characteristics of a mixed signal So1.
Figure 6:
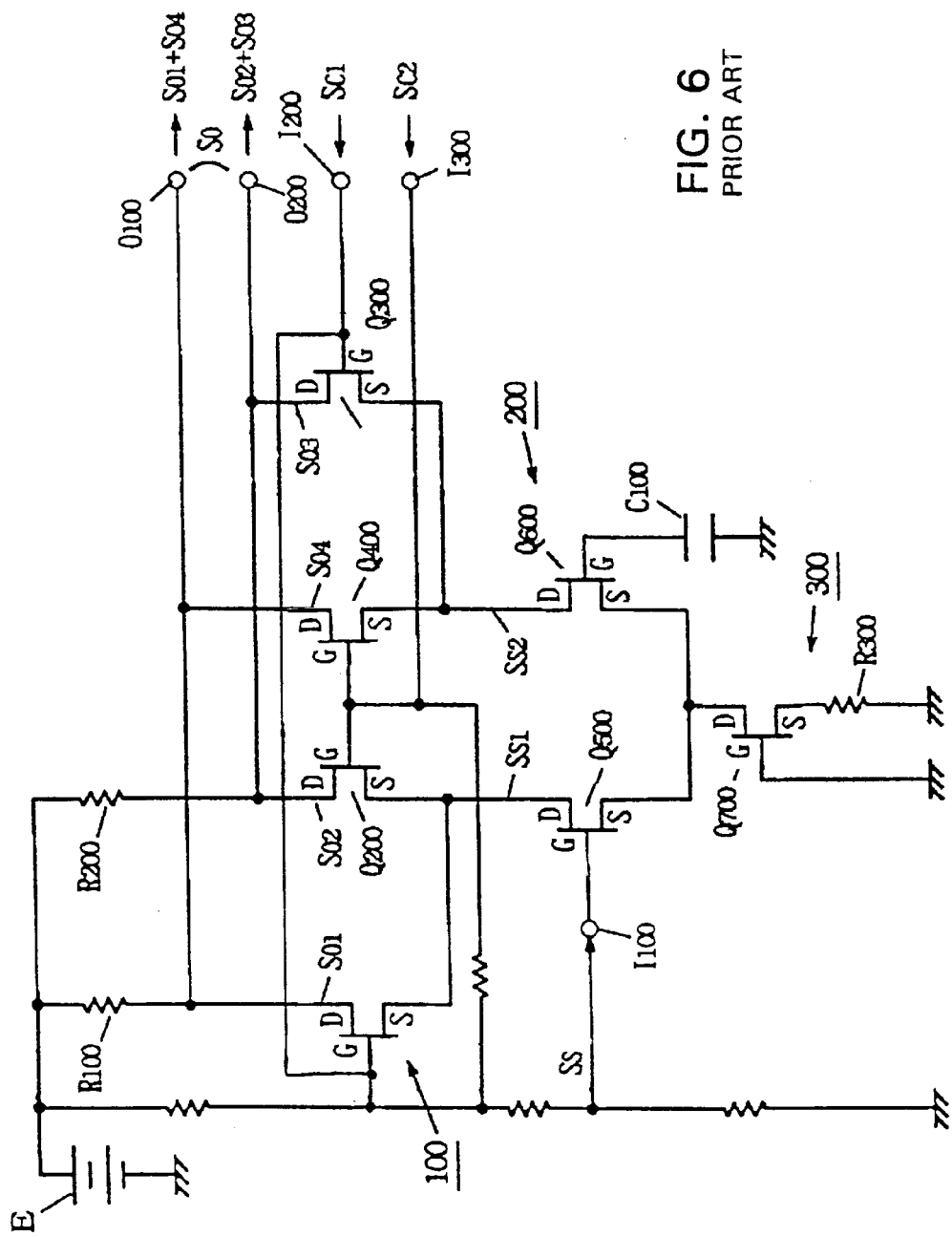
FIG. 6 is a circuit diagram of the configuration of a modulator having a conventional mixer.
Figure 7A:
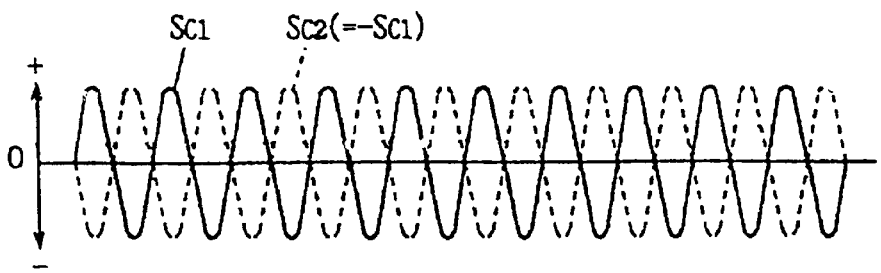
FIGS. 7(a) to 7(c) are waveform diagrams illustrating the operation of the modulator shown in FIG. 6.
Figure 7B:
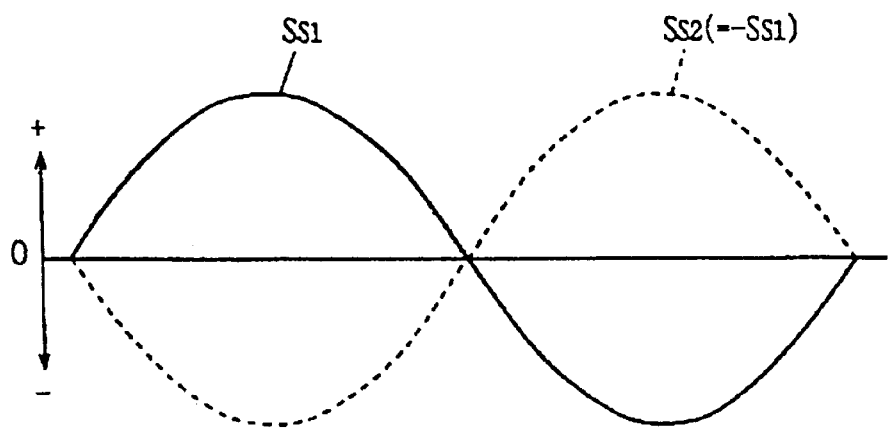
Figure 7C:
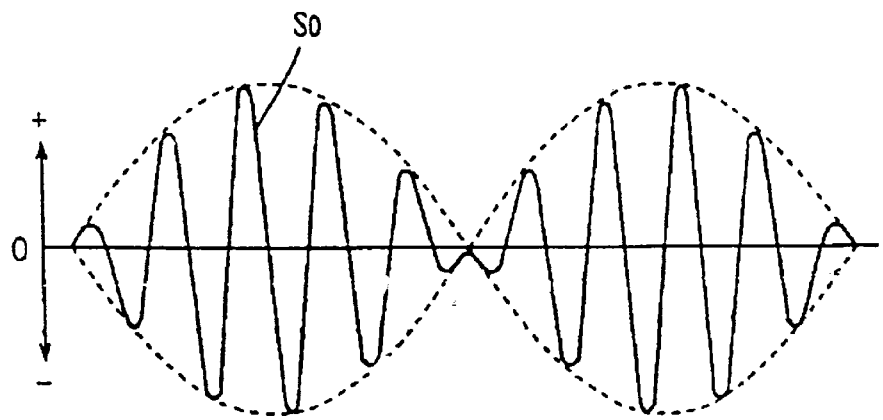

The performance of the BM1 was tested by the present inventor using the circuit shown in FIG. 4. The spectrum characteristics of the mixed signal So1 is shown in FIG. 5 in which α1 and α2 indicate the required signal components (in a frequency range fc±fs) of the mixed signal So1; β0 represents the first carrier signal Sc1 of the mixed signal So1; and β1 to β12 designate unwanted higher harmonic signal components. FIG. 5 thus reveals that good performance of the BM1, such as carrier-wave suppression of 40 dB or higher, and unwanted-wave suppression of 40 dB or higher, can be achieved. In the testing circuit, the capacitors having 6.8 µF and 12 pF were used as source-grounding capacitors for ensuring positive AC grounding, and the other parts, i.e., the capacitors C1 and C2 having a lower capacitance and the coils L1 and L2 having a lower inductance, were used to form the BM1. This also enhances the easy formation of the modulator into an IC.

Although in the above embodiments the mixer is used in an amplitude modulator, it may be applicable to other types of modulators, demodulators, detectors, multipliers, frequency converters, image reject mixers, and the like.

As will be clearly understood from the foregoing description, the present invention offers the following advantages.

According to one aspect of the present invention, it is only necessary to supply a predetermined low voltage such that each FET's drain-source voltage is larger than the FET's gate voltage. Moreover, it is possible to prevent DC from flowing in the first and second FETs, which totally eliminates the power that would be otherwise dissipated in the first and second FETs, thereby enabling the modulator to operate at a lower voltage.

According to another aspect of the present invention, only a small capacitance of a pair of second capacitors is required, thus encouraging the easy integration of the modulator into an IC.

According to still another aspect of the present invention, merely a small inductance of a pair of inductors is required, so that the modulator can be easily formed into an IC. It is also possible to prevent the entry of the first and second mixed signals to the outside of the inductors.

What is claimed is:

1. A mixer for mixing a pair of carrier signals 180 degrees out of phase with each other with a pair of data signals 180 degrees out of phase with each other, said mixer comprising:
   a first FET for generating a first mixed signal by mixing one of said pair of data signals and one of said pair of carrier signals, said first FET receiving at its drain a predetermined voltage and said one data signal superimposed on said predetermined voltage, and receiving at its gate said one carrier signal;
   a second FET for generating a second mixed signal by mixing the other of said pair of data signals and the other of said pair of carrier signals, said second FET receiving at its drain a predetermined voltage and said other data signal superimposed on said predetermined voltage, and receiving at its gate said other carrier signal;
   at least one first capacitor connected to the sources of said first and second FETs such that said sources float for a direct current and are grounded for an alternating current; and
   a differential amplifier for receiving an input data signal and supplying said pair of data signals to said first and second FETs.

2. A mixer according to claim 1, further comprising a pair of second capacitors for generating a third mixed signal by synthesizing said first and second mixed signals, said second capacitors being connected in series with each other between said first and second FETs' drains and exhibiting a low impedance at a frequency of said first and second mixed signals and exhibiting a high impedance at a frequency of said data signals, and supplying said third mixed signal as an output of said mixer.

3. A mixer according to claim 2, further comprising a pair of inductors each of which is connected at one end thereof to a respective one of said first and second FETs' drains, and which exhibit a high impedance at a frequency of said mixed signals and exhibit a low impedance at a frequency of said data signals.

4. A mixer according to claim 3, wherein each of said pair of inductors is connected at another end thereof to said differential amplifier for receiving a respective one of said pair of data signals.

5. A mixer according to claim 1, further comprising a pair of inductors each of which is connected at one end thereof to a respective one of said first and second FETs' drains, and which exhibit a high impedance at a frequency of said mixed signals and exhibit a low impedance at a frequency of said data signals.

6. A mixer according to claim 5, wherein each of said pair of inductors is connected at another end thereof to said differential amplifier for receiving a respective one of said pair of data signals.

7. A mixer for mixing a pair of carrier signals 180 degrees out of phase with each other with a pair of data signals 180 degrees out of phase with each other, said mixer comprising:
   first means including a first semiconductor device for generating a first mixed signal by mixing one of said pair of data signals and one of said pair of carrier signals, said first semiconductor device receiving at a first terminal a predetermined voltage and said one data signal superimposed on said predetermined voltage, and receiving at a second terminal said one carrier signal;
   second means including a second semiconductor device for generating a second mixed signal by mixing the other of said pair of data signals and the other of said pair of carrier signals, said second semiconductor device receiving at a first terminal a predetermined voltage and said other data signal superimposed on said predetermined voltage, and receiving at a second terminal said other carrier signal;
   means connected to respective third terminals of said first and second semiconductor devices for causing said third terminals to float for a direct current and to be grounded for an alternating current.

8. A mixer according to claim 7, further comprising means for generating a third mixed signal by synthesizing said first and second mixed signals, said means exhibiting a low impedance at a frequency of said first and second mixed signals and exhibiting a high impedance at a frequency of said data signals, and supplying said third mixed signal as an output of said mixer.

9. A mixer according to claim 8, further comprising a pair of means each connected to a respective one of said first terminals of said first and second semiconductor devices, and which exhibit a high impedance at a frequency of said mixed signals and exhibit a low impedance at a frequency of said data signals.

10. A mixer according to claim 7, further comprising a pair of means each connected to a respective one of said first terminals of said first and second semiconductor devices, and which exhibit a high impedance at a frequency of said mixed signals and exhibit a low impedance at a frequency of said data signals.

* * * * *